United States Patent [19]

Nguyen Tan Tai et al.

[11] Patent Number: 4,780,668
[45] Date of Patent: Oct. 25, 1988

[54] METHOD AND AN ELECTRONIC CIRCUIT FOR MEASURING VERY WEAK SIGNALS AT HIGH VOLTAGE

[75] Inventors: Paul Nguyen Tan Tai, Paris; Jean-Paul Henon, Versailles, both of France

[73] Assignee: Association Pour La Recherche Et Le Developpement Des Methodes Et Processus Industriels (ARMINES), France

[21] Appl. No.: 716,219

[22] Filed: Mar. 26, 1985

[30] Foreign Application Priority Data

Mar. 30, 1984 [FR] France ................ 84 05021

[51] Int. Cl.⁴ .............. G01R 19/00; G01R 15/08
[52] U.S. Cl. ................... 324/126; 324/127; 324/96
[58] Field of Search ............ 324/96, 126, 158 R, 324/102, 127; 174/143; 356/307, 312; 307/350, 352, 359, 362; 328/162

[56] References Cited

U.S. PATENT DOCUMENTS

| | | | |
|---|---|---|---|
| 3,197,702 | 7/1965 | Schweitzer, Jr. | 324/127 |
| 3,445,814 | 5/1969 | Spalti | 340/310 R |
| 4,070,572 | 1/1978 | Summerhayes | 324/96 |
| 4,204,152 | 5/1980 | Imrie | 324/126 |

FOREIGN PATENT DOCUMENTS

A2219905 10/1973 Fed. Rep. of Germany.

OTHER PUBLICATIONS

Siemens-Zeitschrift, vol. 48, No. 9, Sep. 1974, A. Hederen et al: "Missung von schnellveranderlichen Grossen auf hohem elektrischen Potential", pp. 591-596.
Control Instrumentaion, vol. 11, No. 2, Feb. 1979, R. Widlan: "New op—amp is capable of floating mode operation", p. 7.

Primary Examiner—Reinhard J. Eisenzopf
Assistant Examiner—Vinh P. Nguyen
Attorney, Agent, or Firm—Gerald J. Ferguson, Jr.

[57] ABSTRACT

A method and an electronic circuit for measuring very weak signals at high voltage. The electronic circuit consists of a first portion (I) constituted by at least one amplifier (2) which is DC-connected directly to a source of weak signals. This amplifier is followed by at least one current amplifier (5). A second portion of the circuit (II) then transfers the amplified current signal from high potential to the ground potential of measuring apparatus by a series of transistors (12 to 14) followed by an output amplifier (22). An optional third portion (III) may be provided to sample the signal by an analog gate (25) suitably controlled from an external frequency source. This makes it possible in spectrometry to perform fast and accurate measurements on very weak signals at high potential.

6 Claims, 2 Drawing Sheets

METHOD AND AN ELECTRONIC CIRCUIT FOR MEASURING VERY WEAK SIGNALS AT HIGH VOLTAGE

The invention relates to a method and to an electronic circuit which is usable in particular for measuring signals of very weak amplitude at a DC potential which is very higher than ground potential.

BACKGROUND OF THE INVENTION

In spectrometry, it is often necessary to pre-amplify a current signal by means of an electron multiplier circuit having an output potential of more than 1000 V relative to earth or ground potential. In most cases, these signals are of tiny amplitude. In known measuring apparatus, these signals are initially translated to ground potential by means of isolating capacitors or transformers. A high value resistance serves to convert the current signal into a voltage signal. However, it is well known that the noise power of a resistance R is equal to $4KT \times R$. When making a measurement, this noise is added to the weak signals in addition to any noise due to the connecting cables which are often necessary in conditions of use.

This is true, for example, when performing X-ray or X-ray microsonde analysis. The signals delivered by a proportional detector are often at a potential which is at more than $+1000$ V relative to ground. These signals are transferred to measuring apparatus via a series-connected capacitor and a resistor having a value of 1 gigohm (1 G$\Omega$). The noise amplitude due to this resistance at ambient temperature and at 10,000 counts per second, is 0.4 mV r.m.s., which is of the same order of magnitude as the signals (1 mV). The noise due to the resistance is thus large. It makes it necessary to slow down the counting when performing accurate measurements. This means that the time taken to perform an analysis is considerably lengthened.

The same is true of Auger spectrometers equipped with a dispersive type analyzer in which currents at a few hundred of picoamps are translated from high tensions to common ground potential by means of isolating capacitors or transformers. These AC coupling means determine, in this case, which spectrometry method is being used. There are three sorts of methods:

(1) Energy modulation performed on the analyzer. The modulation component is transmitted to the measuring apparatus via a linking capacitance. This technique is simple, but the information retrieved by this method is incomplete for quantitative analysis. If quantitative measurements are to be performed, the energy distribution of electrons measured by the sample must be measurable, and this can only be done by one of the following two methods.

(2) Chopping the primary excitation beam, or brightness modulation. In this case, a primary beam of electrons from an electron gun is modulated by means of a control grid (Wehnelt). This may be done simply. However, operating in pulse mode introduces distortion and uncertainties in the results. Further, the operating conditions with this method are not adapted to changing easily to another mode of operation, which may either be energy modulation or sample display by means of secondary electrons.

(3) The third method uses a very low analysis current in such a manner that the impacts in the electron multiplier create pulses of current in the multiplier which are compatable with a counting system. This third method is sensitive and accurate provided a sufficiently long counting period is used. This considerably reduces the range of surface analysis which can be performed by means of an Auger spectrometer, given that many surface phenomena change rapidly with time. Further, the cost of a high performance counting chain is very high.

In Leed-Auger spectrometers fitted with an analyzer having delaying fields, the transfer of signals to the measuring apparatus often takes place via an isolating transformer. It is known that the noise level mixed in with the signals is high. The method used for performing these measurements consists in modulating the potential of the analyzer grids, and in performing synchronous detection on the first harmonic of the frequency, thereby obtaining the distribution curve of the electrons emitted. To extract other information, it is necessary to perform synchronous detection tuned to the second harmonic. This method is penalized by the high noise levels. When filters are used, the time necessary for analysis is unreasonably lengthened.

The main object of the invention is to measure signals of very weak amplitude at a DC potential relative to ground which is high or very high, such signals could come from a detector. The measurement is to be performed without reducing the signal to noise ratio and without the connection of the active circuits being sensitive to noise due to a cable link, if required. The measurements should extract the best possible sensitivity from the detectors or analyzers used.

A secondary object of the invention is to save time when using appropriate filtering for measuring weak signals buried in noise, by improving the signal to noise ratio.

SUMMARY OF THE INVENTION

The above-mentioned main object of the invention is achieved, by the method according to the invention, by amplifying the weak signal at high potential, by transforming the voltage signal into a current signal representative thereof, and only then reducing the potential of the signal to ground, where the signal is measured. Secondarily, if the amplified signal is accomplished by unwanted noise, it is sampled either before or after being translated to ground potential, depending on the origin of the weak signal at high potential.

The method is implemented by means of an electronic circuit constituted by combining two portions, of which the first portion comprises a voltage amplifier or a current amplifier which is DC coupled to the source of the signals, e.g. at the output from an electron multiplier, and in this case the amplifier is an electrometer. It is followed by at least one current amplifier. When the common mode voltage of the signal is very high, the first portion of the circuit has its own power supply which is substantially at the same potential as the signals, for example at the high output tension of an electron multiplier.

According to the invention, the second portion of the circuit translates the current signals from the first portion substantially to the ground potential of the measuring apparatus. When the signals are DC signals, the second portion comprises at least one transistor, and generally a series of transistors. The transistors may be bipolar transistors or field effect transistors and their voltage strength and polarities are chosen to be suitable. The transistors may be Darlington or composite types. The transistors are connected in series when it is necessary to use a plurality of transistors to share the voltage drop. In this case, a series of equal value resistances serves to bias the transistors. One end of the series of resistances is connected to the power supply circuit of the first portion of the circuit as described above, and the other end is connected to the common ground. The current signals are transferred to the common ground by the collector of the last (or only) transistor and via a resistance connected to the common ground. The voltages of the signals are measured across the terminals of this resistance. These voltages may be amplified by means of an amplifier. The amplifier may be DC coupled and fitted with external controls if necessary. Otherwise, the amplifier may operate by means of pulses which are shaped and then integrated. The output from this last stage constitutes the end of the second portion of a circuit in accordance with the invention.

It is desirable, when the signals to be measured are accompanied by unwanted noise, to use a third portion of the circuit in accordance with the invention, which third portion is placed either before or after the second portion of the circuit. In accordance with the invention, this third portion samples the amplified signals and constitutes a filter means providing protection against noise. It is constituted by at least one analog gate inserted on the signal path at a point in the circuit which is chosen as a function of the intended use. Thus, when the invention is used in Auger spectrometry, the signal is preferably sampled at the high potential of the first portion of the circuit. In this case, the analog gate is inserted between the signal input amplifier and the current amplifier. The circuit constituting the gate receives the same power supply voltages as the first portion of the circuit in this case. The sampled signal is then transmitted via the second portion of the circuit without being affected by any imperfections it may have.

The sampled signal is an AC signal, and it is therefore obvious that it can be transferred to the common ground potential via at least one capacitor of suitable value, which capacitor would constitute the second portion of the circuit for connecting the output of the first portion to the common potential. However, the use of a capacitor is limited to transmitting AC signals at fairly high frequencies.

In other uses of the invention, the above-mentioned third portion may be placed after the second portion of the circuit to sample the signal at the output therefrom.

In all cases, the sampling is performed by means of an analog gate controlled by a signal having a suitable period generated by a circuit which is external to the circuit of the invention and which serves to control opening and closing of the gate. The gate is biased in such a manner as to enable measurements to be performed either with or without sampling.

The reconstitution or demodulation of the sampled signal is performed by external circuits which do not constitute a part of the invention using well-known techniques such as synchronous or synchrodyne detection for reconstituting the signal prior to sampling on an averaged basis, and thus having an improved signal to noise ratio.

BRIEF DESCRIPTION OF THE DRAWINGS

Two embodiments of the invention are described, by way of example, with reference to the accompanying drawings, in which.

MORE DETAILED DESCRIPTION

Figure 1:
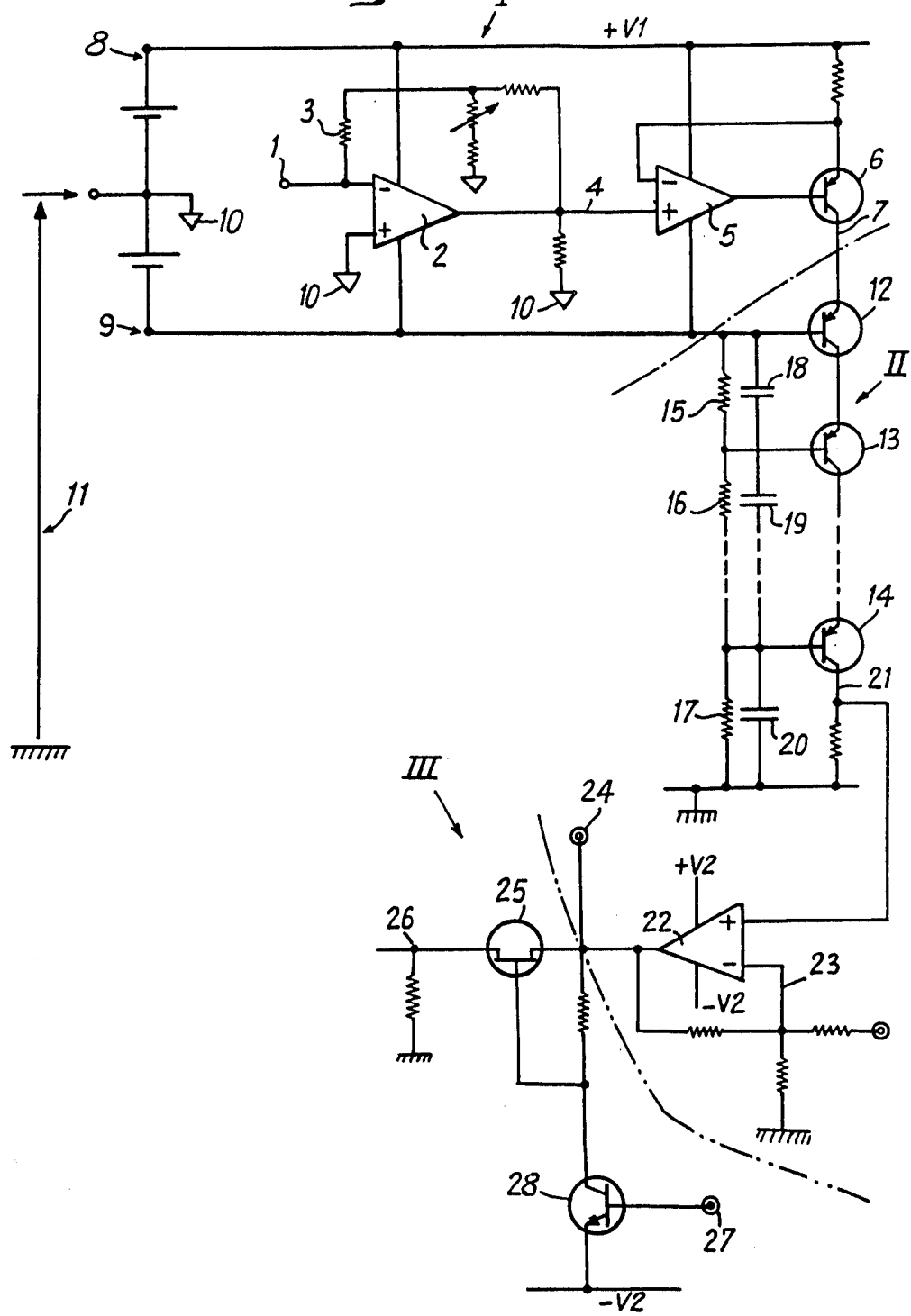
FIG. 1 is a circuit diagram of a first electronic circuit in accordance with the invention and having a third or sampling portion placed after the second portion.

Reference is made initially to FIG. 1.

The first portion I of the circuit in accordance with the invention is separated from the second portion II in FIG. 1 by means of a dot-dashed line. The current signal to be measured is applied to the first portion I by being directly connected to an input 1 of an amplifier 2. If a voltage is to be measured, the signal is applied to the amplifier 2 via the input 1 and via a resistance of suitable value chosen in conjunction with a feedback resistance 3 to obtain the chosen gain. After passing through the amplifier 2, the signal is transferred via a wire 4 to an input of a current amplifier constituted by an amplifier 5 and a PNP transistor 6. The output signal is delivered by the collector 7 of the transistor 6. This circuit is merely one example of a circuit suitable for constituting the first portion I of a circuit in accordance with the invention. It is powered by a voltage source that is isolated from the common ground and which has opposite terminals 8 and 9 about a mid-point 10 in the circuit illustrated. The potential of the point 10 is the reference potential of the first portion I of the circuit. The potential difference between the power supply and the common ground of the measuring instruments is represented by an arrow 11. The high tension end of the arrow 11 is thus connected to the common rail 10 of the first portion I of the circuit which is thus at a high common mode tension.

The second portion of the circuit in accordance with the invention is referenced II in the figure and is separated from the third portion III by a double-dot-dashed line.

The signals are transferred across the potential difference between the first portion of the circuit I and the ground potential of the following apparatus via a series of transistors connected in the common base or common drain configuration. The number of transistors depends on the value of the potential across which the signal is to be transferred. In the embodiment shown, there are three PNP bipolar transistors 12, 13 and 14. They are biased by series-connected resistors 15, 16 and 17 together with filtering capacitors 18, 19 and 20. This set of transistors and its biasing bridge provides a DC connection between the potential of the first portion I of the circuit in accordance with the invention at the input 15, 18 and 12 to the common ground potential at 17, 20 and 14. The signals from the transistor 6 leave via the collector 21 of the last transistor 14. These signals are amplified by at least one amplifier 22 having an input 23 connected to receive a DC offset bias for setting the DC level of the signal available at its output 24 at which measurements may be performed.

In many circumstances the circuit in accordance with the invention may be limited to the two portions I and II. Since the signal is amplified prior to being brought to the ground potential of the measuring apparatus, it swamps any noise added by the portion II of the circuit. However, if the signal is accompanied by unwanted noise which is amplified together with the signal, it is advantageous to use the portion III of the circuit. This third portion samples the signal at the output 24 from the portion II. The signal arriving at the output 24 is passed through an analog gate 25 to a load resistance 26. A signal at an appropriate frequency is applied to the input 27 of a transistor 28 controlling the gate 25 to enable the load resistor 26 to receive samples of the signal at the output 24.

The sampled signal available at 26 may be processed by a known circuit for reconstituting the signal, which circuit is not included per se in the circuit in accordance with the invention.

Figure 2:
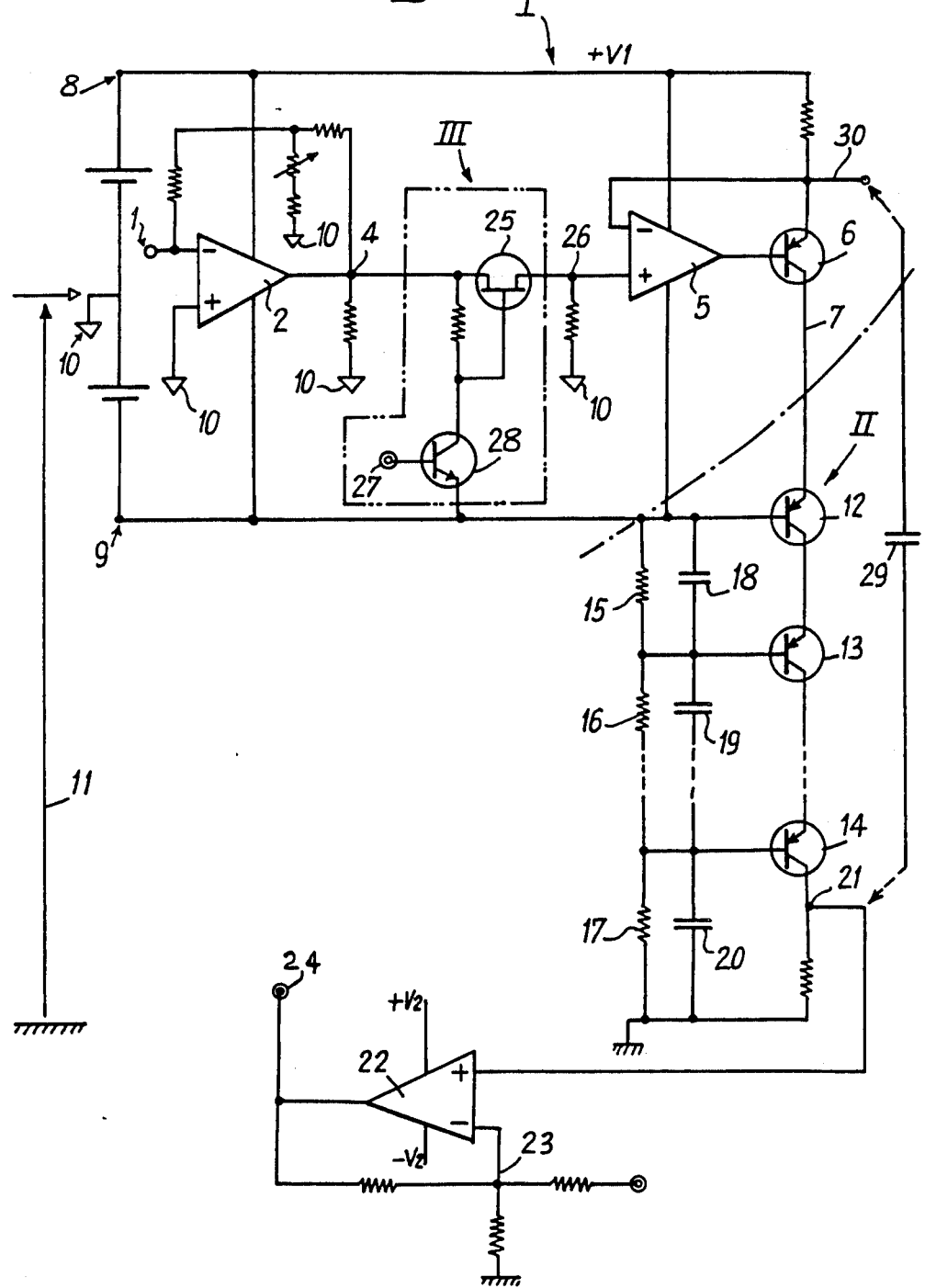
FIG. 2 is a circuit diagram of a second electronic circuit in accordance with the invention and having a third or sampling portion placed prior to the second portion.

Reference is now made to FIG. 2 for describing a second example of a circuit in accordance with the invention. This circuit is intended for use in an Auger spectrometer, but this intended use is mentioned for illustrative purposes only, and does not limit the possible applications of the circuit.

The circuit diagram is similar to the first example of FIG. 1 except in that the sampling circuit constituting the third portion of the circuit in accordance with the invention is differently located. This third portion III is identical to the third portion described with reference to FIG. 1 and is surrounded by a double-dot-dashed line in FIG. 2 to show it up more clearly. It is connected as follows: the analog gate 25 is inserted between the output 4 from the amplifier 2 and the input to the amplifier 5; the gate-controlling transistor 28 is powered by the same voltage 9 as powers the first portion I; the input 27 to the transistor 28 is capable of receiving a signal at an appropriate frequency for controlling the gate from a circuit not included in the circuit of the invention. In this configuration, the amplifier 5-6 transmits samples of the signals in the form of current towards the common ground via the second portion II of the circuit as described above. The signals are made available at the output 24 from the amplifier 22. They are then reconstituted as mentioned above by circuits which are not included in the invention.

Naturally, in some cases a capacitor 29 of suitable value could replace the set of components 15, 16, 17, 18, 19, 20, 12, 13 and 14 for transposing the AC signals towards the common ground. In which case the capacitor provides an AC connection between the output point 30 (the emitter of the transistor 6) of the amplifier 5-6 to the input point 21 to the amplifier 22 via a resistance which is not shown.

By way of example, the following commercially available components are suitable for used in the above-described circuits: amplifier 2—AD 515 K; for the amplifiers 5 and 22—LF 355; for the analog gate 25—2N 4091; for the transistor 28—BC 437 b NPN; for the transistor 6—BC 307 b PNP; and transistors 12, 13, 14—BC 393 PNP (common Ve=180 V).

Thus, it can be seen that the invention confers a new measuring method which is particularly useful for use with a Leed-Auger XPS spectrometer. The method makes it possible to perform spectrometry without modulating or chopping the electron beam, thus avoiding using the optics at high dynamic regimes whose transfer functions are not well known and whose convolution products on the signal are therefore not well known either. The circuit in accordance with the invention may be used to directly measure the results given by the type of analyzer used at high measuring sensitivity and with improved analysis sensitivity by virtue of the improved signal to noise ratio. The response of the circuit composed of active components is rapid. Spectrometry measurements may thus be accelerated to track a phenomenon that changes with time. Further, the circuit in accordance with the invention performs its measurements downstream from the analyzer, thus enabling switch-over of the mode of analysis to the mode in which secondary electrons are displayed by simple switching means, and without requiring other parameters to be adjusted as is necessary when switching over from the method using analysis beam chopping. It is thus easier to automate spectrometry. It may be observed that the circuit in accodance with the invention operates successfully as a pulse amplifier, and may thus be followed by a counter or by an integrator.

As has already been mentioned, the circuit in accordance with the invention may be used for DC measurements as well as for AC measurements. When performing AC measurements, the series of transistors 12 to 14 in the portion II may be replaced by a series of capacitances, or transformers, or by optical fiber transmission means. Its use in X-ray or X-ray microsonde spectrometers has the advantage of low noise level, and low bulk. In such a case it may replace the entire counting system and serve as counting means itself. Such an embodiment is readily integrated in a miniaturized apparatus.

It may be observed that the circuit in accordance with the invention is capable of being used successfully in apparatuses which use signals derived from detectors which suffer from severe electromagnetic influences.

We claim:

1. An electronic circuit for measuring a very weak signal at a high potential relative to ground potential, for detecting signals of a magnitude comprising:
   a first portion including a first amplifier means having an input means and an output, said input means being for applying the signal to be measured for producing a current signal which is substantially a function of the very weak signal, and a current amplifier means having an input which is connected to said output of said first amplifier means for producing an amplified current signal at high potential;
   another amplifier means; and
   a second portion including a series of transistors connected in a common base configuration with a plurality of resistance elements biasing said transistors, the number of resistors used being sufficient for sharing the voltage drop between said high potential and said ground potential, the emitter of a first transistor of said plurality of transistors being connected to the output of said current amplifier means and the collector of a last one of said plurality of said transistors being connected to an input of another amplifier means having an output, the output of said another amplifier means being connected to a measuring means.

2. An electronic circuit according to claim 1, for use with DC signals, wherein said second portion biased from high voltage to the ground comprises at least one transistor receiving current signals from said current amplifier means of the first portion of the circuit, said current signals being received via an emitter of said transistor, said current signals being transferred towards to the common ground potential of said measuring means via a collector of said transistor, said transistor being biased by a potential taken from a resistive potential divider chain connected between high potential of the first portion of the circuit and the common ground potential.

3. An electronic circuit according to claim 2, wherein the second portion comprises a plurality of transistors connected in series with the collector of the first transistor being connected to the emitter of the next transistor, the collector of the last transistor being connected to the common ground potential via a load resistance, the bases of said transistors being biased from respective points along said resistive potential divider, and said points being chosen to suitably share out the potential difference between the various transistors.

4. A circuit according to claim 1, further including a third portion for sampling the signal, said third portion comprising an analog gate having an input connected to the output from the second portion, and an output, said gate having external means for controlling the opening and closing thereof at an appropriate frequency.

5. A circuit according to any one of claims 2 or 3 wherein the second portion is terminated by measuring means comprising at least an amplifier having its input DC connected to a collector of the last transistor.

6. A method of measuring very weak signals at high potential, the method comprising the steps of amplifying the weak signals, transforming them into current signals, and then transferring them to ground potential prior to measuring them, for use when said amplified signals are accompanied by unwanted noise, wherein a sampling operation is performed on amplified noisy signals after said signals have been transferred to ground potential.

* * * * *